(12) United States Patent
Melkote et al.

(10) Patent No.: US 12,336,131 B2
(45) Date of Patent: Jun. 17, 2025

(54) WELD SPATTER PROTECTIVE COVER DEVICE FOR PLASTIC MODULE AND MODULE INCLUDING A PROTECTIVE COVER DEVICE

(71) Applicant: Rockwell Automation Asia Pacific Business Center Pte. Ltd., Singapore (SG)

(72) Inventors: Srinivasan Melkote, Singapore (SG); Woon Hwee Kiew, Singapore (SG); Wee Kong Tam, Singapore (SG)

(73) Assignee: Rockwell Automation Asia Pacific Business Center Pte. Ltd., Singpore (SG)

( * ) Notice: Subject to any disclaimer, the term of this patent is extended or adjusted under 35 U.S.C. 154(b) by 431 days.

(21) Appl. No.: 17/953,880

(22) Filed: Sep. 27, 2022

(65) Prior Publication Data
US 2024/0107695 A1  Mar. 28, 2024

(51) Int. Cl.
*H05K 5/03* (2006.01)
*H05K 5/00* (2006.01)

(52) U.S. Cl.
CPC ............. *H05K 5/03* (2013.01); *H05K 5/0069* (2013.01)

(58) Field of Classification Search
CPC ...... H01R 13/52; H01R 13/527; H01R 13/53; H01R 13/5213; H01R 13/533
See application file for complete search history.

(56) References Cited

U.S. PATENT DOCUMENTS

| | | | | |
|---|---|---|---|---|
| 4,979,907 A | * | 12/1990 | Lee ...................... | H01R 25/006 439/652 |
| 6,454,584 B1 | * | 9/2002 | Milan .................... | H01R 31/02 439/620.21 |
| 2006/0258226 A1 | * | 11/2006 | Milan .................. | H01R 13/514 439/652 |
| 2010/0104814 A1 | | 4/2010 | Richardson et al. | |

(Continued)

FOREIGN PATENT DOCUMENTS

SE    375 217 B    4/1975

OTHER PUBLICATIONS

Allen-Bradley, Installation Instructions, ArmorBlock 2-port Ethernet/IP Modules with QuickConnect, Rockwell Automation Publication 1732E-IN010E-En-E, Nov. 2021, 16 pages.

(Continued)

*Primary Examiner* — Ross N Gushi
(74) *Attorney, Agent, or Firm* — Feng Wei

(57) ABSTRACT

A spatter protection cover for an electronics module includes a top wall that covers a top surface of a plastic module housing. The cover can include side walls and end walls that cover the side surfaces and end surfaces of the plastic housing. The cover can be a one-piece metallic construction that fits over the plastic module housing or can be defined by separate cover sections that can be adhesively applied to the plastic module housing. The top wall of the cover can include connector openings and/or indicator openings for aligning with connectors and indicator lights, respectively, of the plastic module housing. The cover can include ribs that establish and maintain a select thermally insulative air gap between the top wall of the cover and the top surface of the plastic module housing.

16 Claims, 8 Drawing Sheets

(56) References Cited

U.S. PATENT DOCUMENTS

2022/0159882 A1    5/2022  Salter et al.

OTHER PUBLICATIONS

ArmorBlock I/O Module, Bulletin 1732, Selection Guide, Rockwell Automation Publication 1732-SG001I-EN-E, Jun. 2021, 5 pages total (front cover, rear cover, pp. 6-8).
Partial European Search Report, dated Mar. 1, 2024, in connection with European Appln. No. 23187248.2.

* cited by examiner

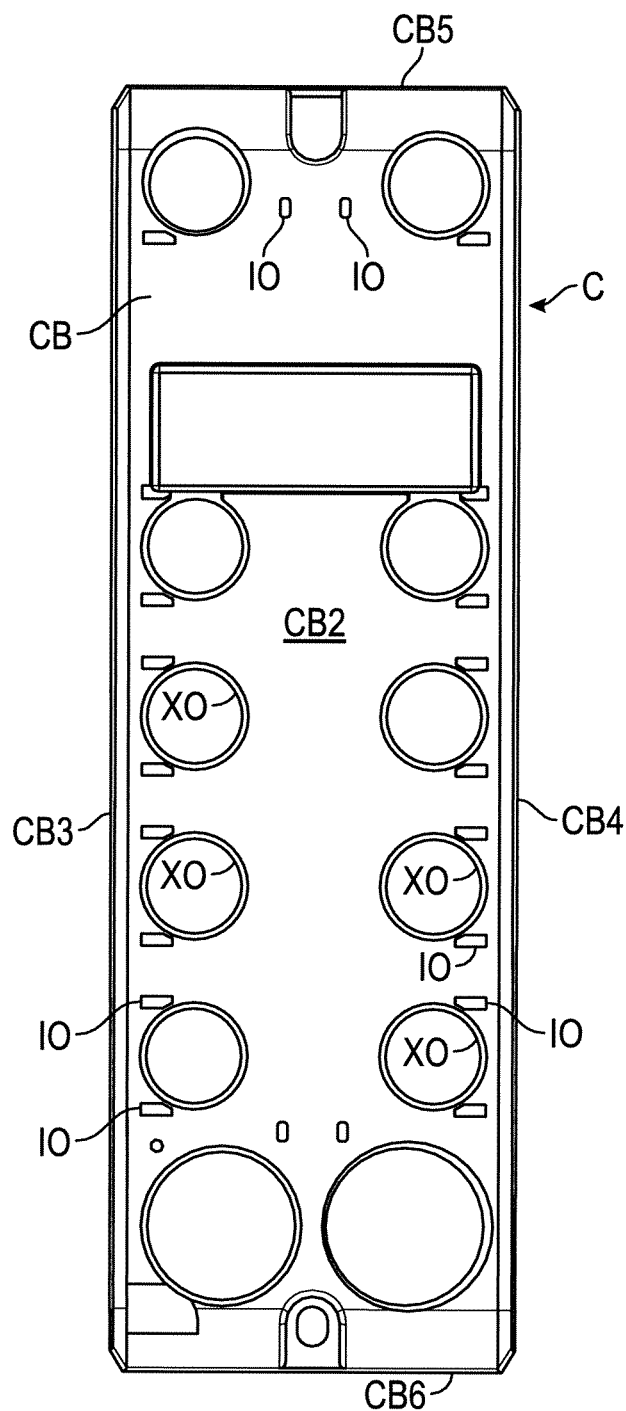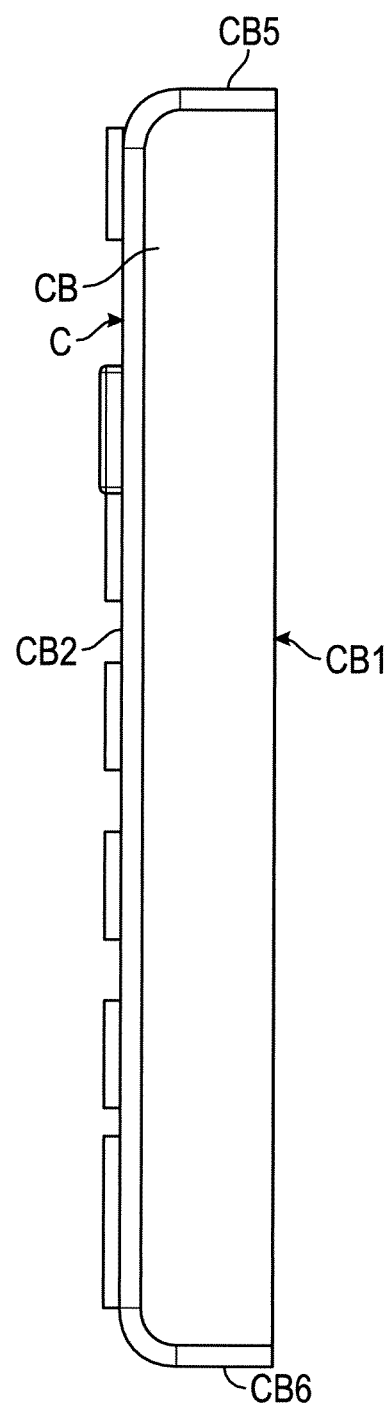
FIG. 3  FIG. 4

WELD SPATTER PROTECTIVE COVER DEVICE FOR PLASTIC MODULE AND MODULE INCLUDING A PROTECTIVE COVER DEVICE

BACKGROUND INFORMATION

Modules with polymeric or "plastic" housings for enclosing electronics are ubiquitous in industrial settings such as manufacturing, packaging, processing and other environments. Examples of these plastic electronics modules include modules that form part of an industrial automation system including controller modules, communications modules, input/output (I/O) modules, and the like. In certain environments where spatter from hot liquids or molten metals or molten polymeric materials such as from welding or other industrial processes can contact the module, modules with plastic housings are unsuitable because the hot spatter material contacts the plastic housing and deforms, degrades, and/or otherwise damages the plastic housing. Damage to the housing can include openings or deformations of the housing, damage to or deformation of indicator lights or other indicia of the housing, contamination, exposure. or other damage to the internal electronic components, and other harmful effects. Modules with metallic housings are known and can be used in these environments, but these metallic modules must be specially manufactured, specially purchased and/or stocked by users, and may not always be available immediately when needed. As such, a need has been identified for a new and improved solution to prevent damage to plastic electronics modules such as industrial automation modules due to hot spatter from welding or other industrial processes.

BRIEF DESCRIPTION

In accordance with one aspect of the present development, an electronics module includes a plastic housing with an interior space containing a printed circuit board assembly including electronic components. A cover is fixedly secured to the plastic housing to protect said plastic housing from hot spatter materials.

In accordance with another aspect of the present development, the cover can comprise a one-piece metallic structure that fits over the plastic housing or can comprise a plurality of metal cover sections that are adhesively applied to the plastic housing.

In accordance with another aspect of the present development, the cover top wall can comprise a plurality of connector openings and/or indicator openings that are aligned respectively with connectors and indicator lights of the plastic module housing.

In accordance with another aspect of the present development, the cover can include a plurality of ribs on an inner surface of the top wall that establish and maintain a thermally insulative air gap between the cover top wall and the plastic module.

In accordance with another aspect of the present development, a spatter protection cover for an electronics module includes a metallic top wall with a plurality of connector openings and a plurality of indicator openings. The metallic top wall is adapted to be positioned in covering relation with an associated module top surface with said connector openings and said indicator openings aligned respectively with associated connectors and associated indicator lights located on the associated module top surface.

In accordance with another aspect of the present development, the cover is a one-piece metallic structure or is defined from a plurality of separate metallic cover sections that can be adhesively applied.

BRIEF DESCRIPTION OF THE DRAWINGS

FIG. 3 is a top plan view of a protective cover device for an electronics module according to one embodiment of the present development.

FIG. 4 is a right-side view of the protective cover device of FIG. 3.

DETAILED DESCRIPTION

Figure 1:
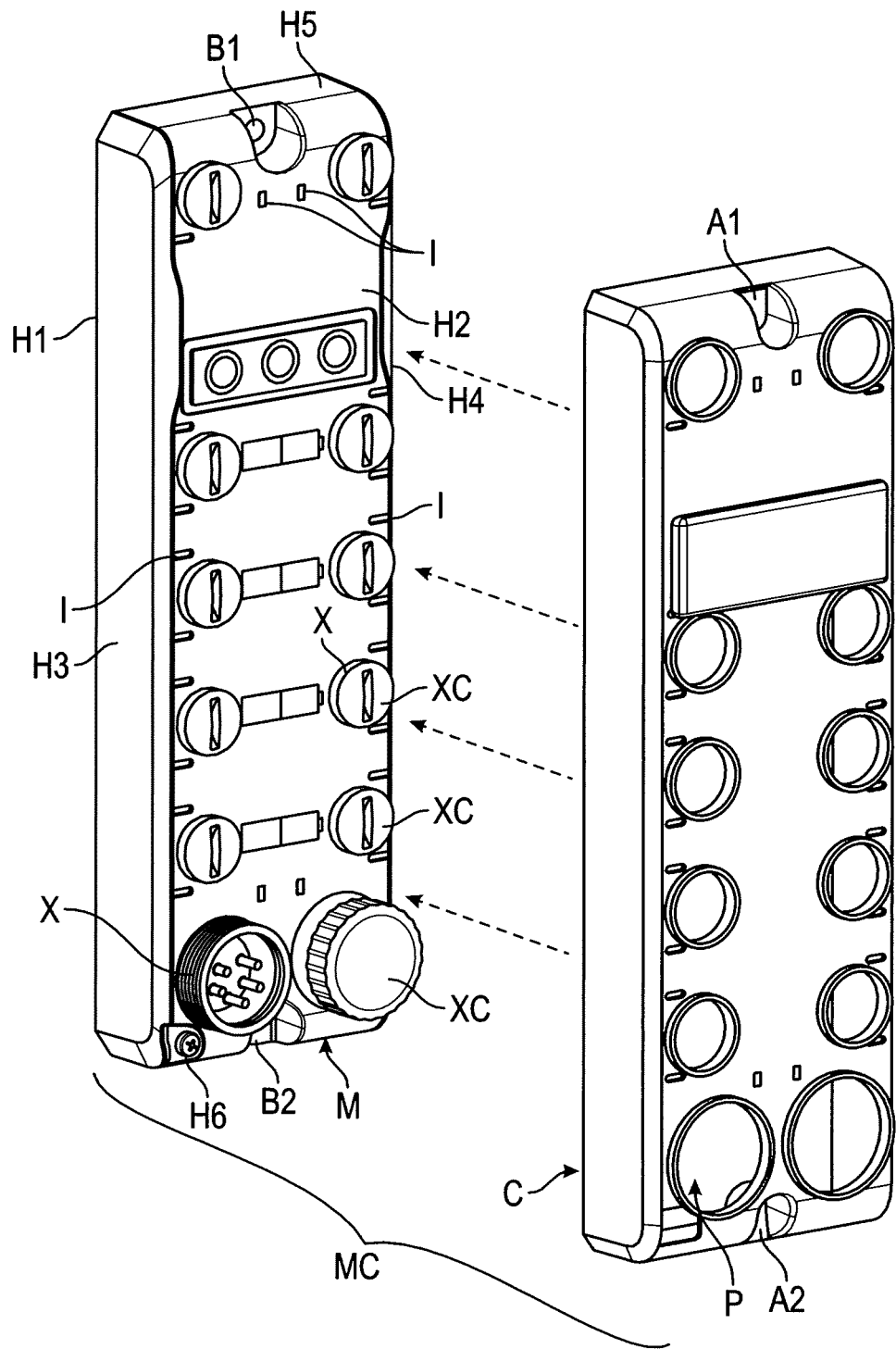
FIG. 1 is an exploded isometric view of an electronics module with a protective cover device provided in accordance with an embodiment of the present development, including a conventional plastic electronics module and a protective cover device that is adapted to be connected to and cover the plastic module to protect the plastic module from weld spatter and other hot materials.
Figure 2:
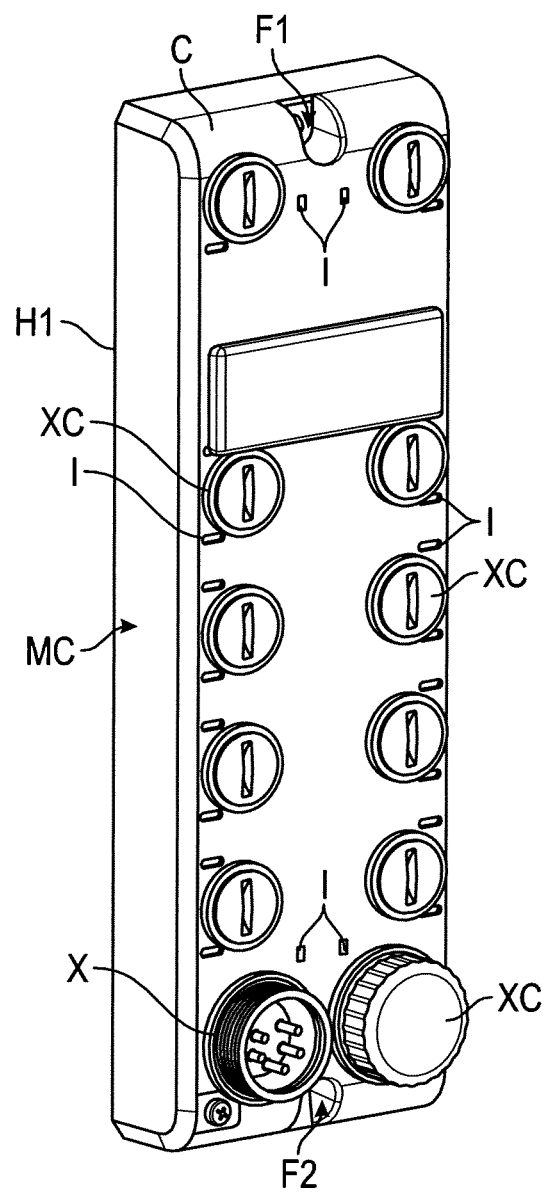
FIG. 2 is a fully assembled isometric view of the module of FIG. 1.
Figure 5:
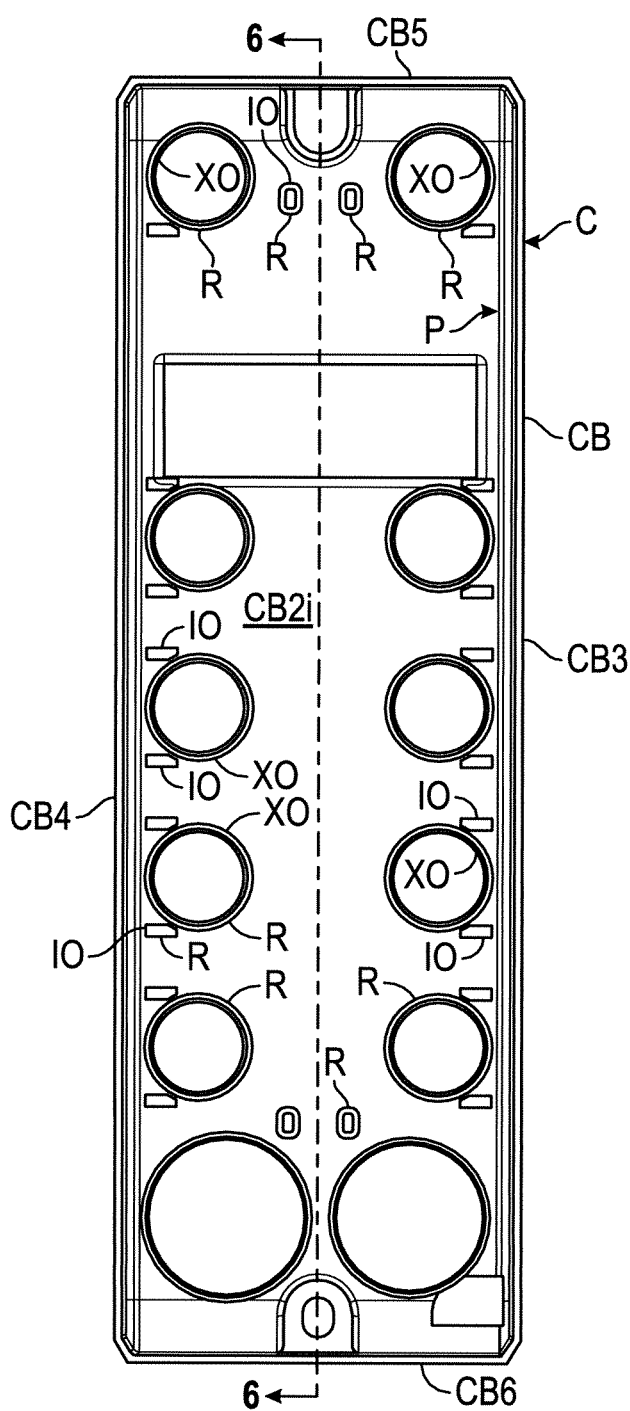
FIG. 5 is a bottom view of the protective cover device of FIG. 3.
Figure 6:
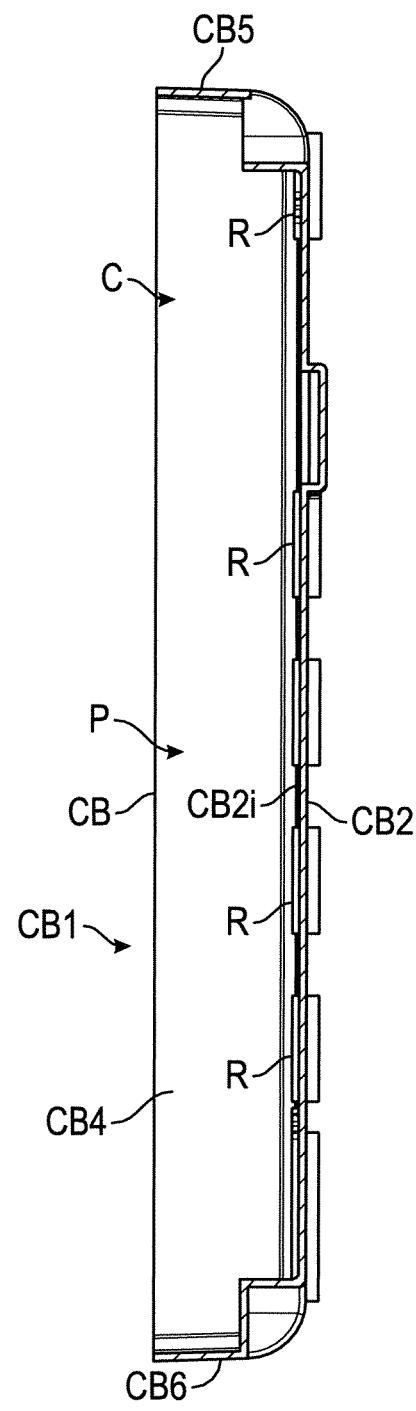
FIG. 6 is a section view taken at section line 6-6 of FIG. 5.
Figure 7:
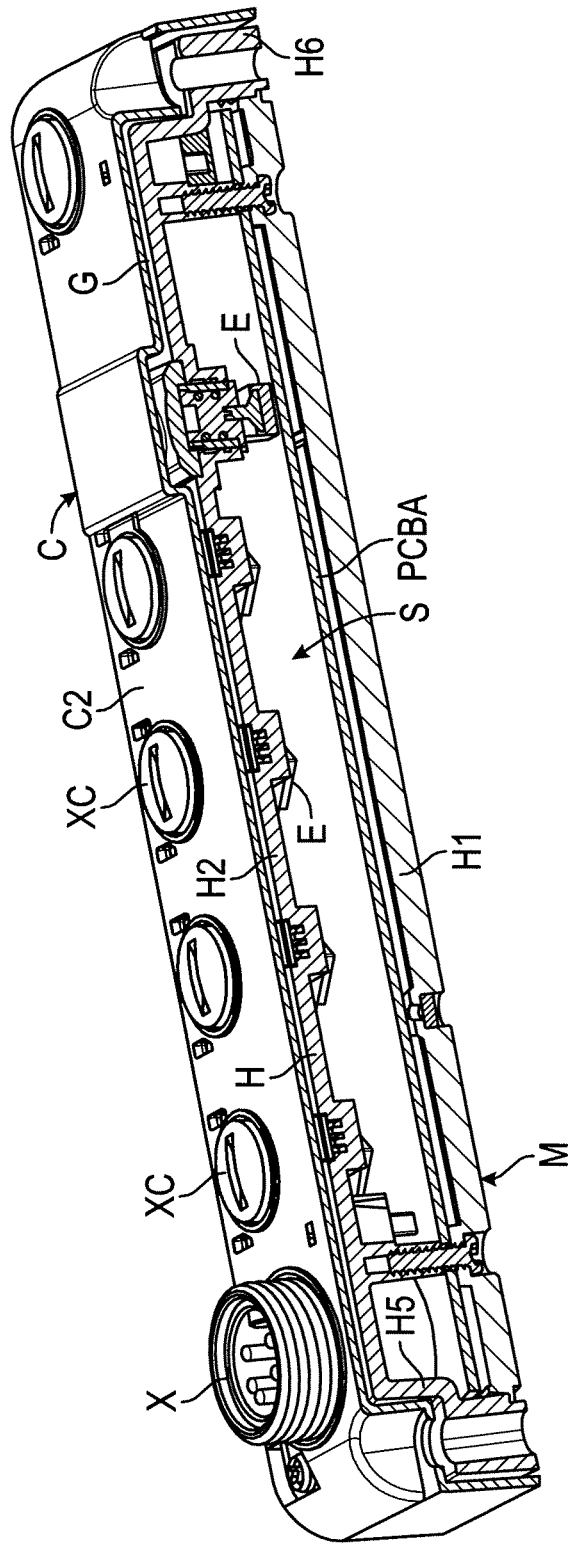
FIG. 7 is a section view that is similar to FIG. 6 but shows the plastic module on which the protective cover device is operatively installed to protect the plastic module.
Figure 8:
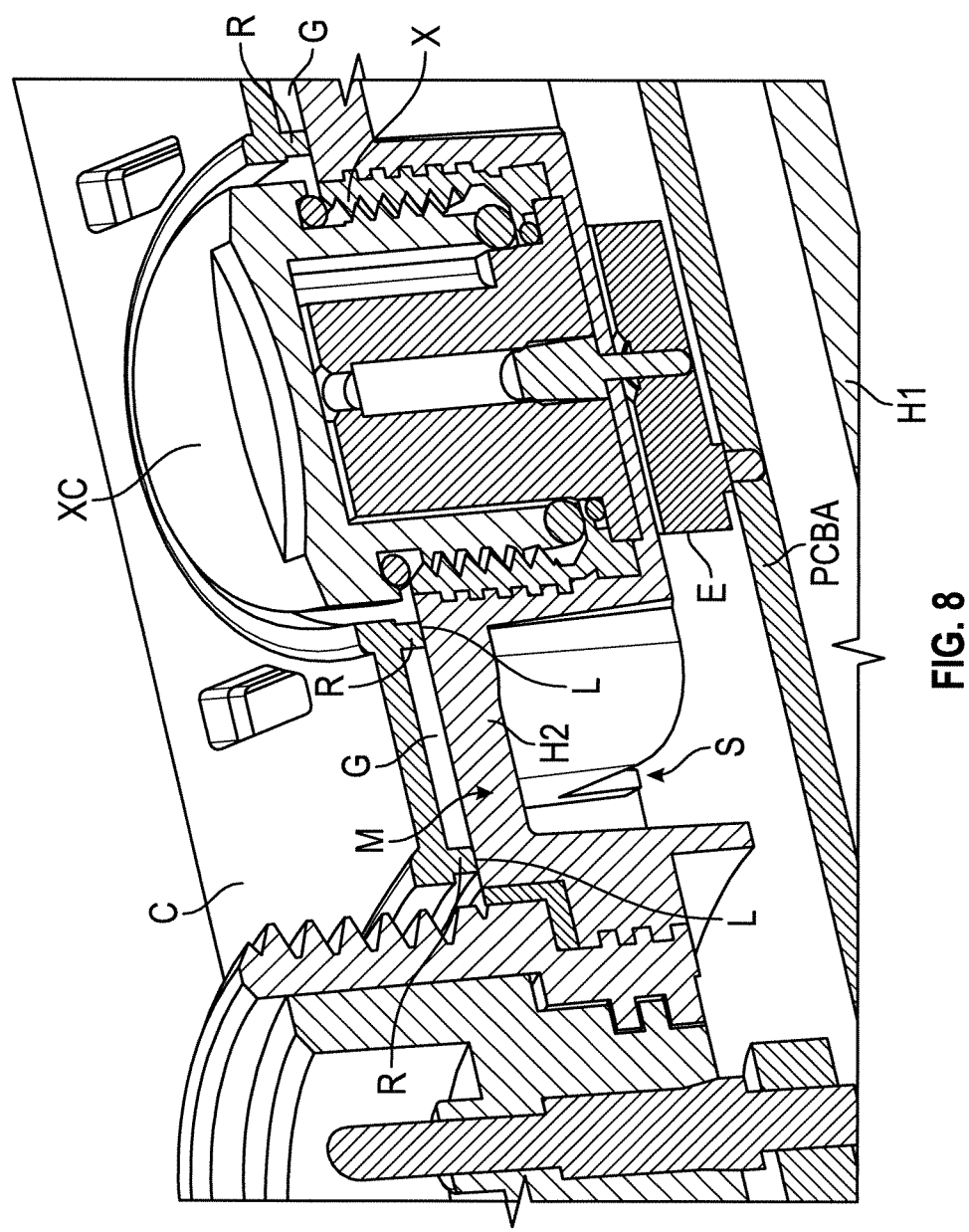
FIG. 8 is an enlarged view of a portion of FIG. 7.

FIG. 1 shows an exploded isometric view of a spatter-protected electronics module MC provided in accordance with an embodiment of the present development. More particularly, the spatter-protected module MC includes a conventional plastic (i.e., polymeric or resinous) electronics module M and an outer protective cover or cover device C that is connected to and covers the plastic module M (as shown in FIG. 2) to protect the plastic module M from hot spatter materials such as weld spatter or the like. The plastic module M, itself, can be conventional and comprises a plastic housing H made from a molded or otherwise formed polymeric or resinous material. The housing H defines an interior space S (see FIGS. 7 & 8) that contains electronic components such as one or more printed circuit board assemblies PCBA with electronic components E (FIG. 8) such as microprocessors, memory, resistors, switches, diodes, LEDs, and the like installed thereon. The illustrated plastic module M further comprises a plurality of indicator lights I that can be illuminated via light-emitting diodes (LED) or other light sources located on a printed circuit board assembly PCBA within the interior space S. The illustrated plastic module M also comprises a plurality of electrical connectors X operably connected to the internal electronic components E and adapted to be connected to mating connectors of associated cables or other mating connector devices. The connectors X can each include a respective dust cover XC operatively connected thereto to protect the connector X from contamination by solid or liquid contaminants.

A rear surface H1 of the plastic module housing H (see also FIG. 7) is typically abutted with a support surface of a machine, cabinet, or other mounting location. The module housing H also includes a top wall or surface H2, along with left side H3, right side H4, first end H5, and second end H6 walls or surfaces that define a peripheral edge of the module housing H and that each extend between and interconnected the rear and top surfaces H1,H2 of the housing H. The left and right side surfaces H3,H4 can be arranged parallel to each other. The first and second end surfaces can also be arranged parallel to each other.

Because the plastic module housing H is defined from a polymeric/resinous material, it is susceptible to melting, deformation, and other damage from hot materials such as molten metal weld spatter and the like that contact the housing H when emitted from surrounding processes or operations. FIG. 2 is an isometric view of the protected module MC with the protective cover or cover device C fully and operatively installed on the plastic housing H to protect the plastic module housing H from the harmful effects of weld spatter and other hot substances. More particularly, the cover device C is closely fitted over the plastic module housing H such that the cover device C covers all parts of the housing H, except the rear surface H1 of the housing H is typically not covered by the cover C but it can be. As such, the cover device C covers the top, left side, right side, first end, and second end surfaces H2-H6, and the cover device C can optionally also cover the rear surface H1 but it is typically not required since the rear surface H1 is not exposed to weld spatter or other hot spatter materials. The cover device C can be operatively and fixedly secured to the to the plastic housing H of the module M by any suitable means such as a snap fit, a friction or interference fit, an adhesive, fasteners, or other suitable convenient fastening devices or means. In the illustrated example, the plastic housing H includes first and second mounting bores B1,B2 (FIG. 1) and the cover device C includes first and second mounting apertures A1,A2 that can be respectively registered with the first and second mounting bores B1,B2 when the cover device C is operatively installed on the housing H, and first and second screws or bolts or other threaded fasteners F1,F2 are respectively installed in the aligned bore/aperture pairs A1,B1 and A2,B2 so that the fasteners F1,F2 secure the cover device C to the housing H. The same fasteners F1,F2 can also extend entirely through the housing H beyond the rear surface h1 into the support surface with which the rear surface M1 of the module M is abutted to secure the module M to the support surface.

The protective cover device C is shown by itself in FIGS. 3-6. In one example, the cover device comprises a one-piece metallic structure such as a monolithic die-cast structure or a stamped or otherwise formed metal structure. Suitable metals include aluminum, stainless steel, zinc, or any other suitable metal. In an alternative embodiment, the cover device C can be defined from and/or comprise a non-metallic heat-resistant material such as a ceramic material, a high-temperature resistant polymeric material, or other high temperature resistant material.

The cover device C is dimensioned and conformed to closely fit over all exposed surfaces H2-H6 of the plastic module housing H. As shown, the cover device C, itself, comprises a one-piece cover body CB that includes or defines an open, concave space P (FIGS. 5 & 6) that is adapted to closely receive the plastic module housing H therein. The concave space P of the cover C opens through a rear side CB1 of the cover body CB. The cover body CB further comprises a top wall CB2, a left side wall CB3, a right side wall CB4, a first end wall CB5, and a second end wall CB6. The left side wall CB3 and right side wall CB4 are spaced-apart from each other and can be arranged parallel to each other. Similarly, the first and second end walls CB5, CB6 are spaced apart from each other and can be arranged parallel to each other. The first and second end walls CB5,CB6 each extend between and interconnect the left side and right side walls CB3,CB4. As such, the left side, right side, first end, and second end walls CB2-CB6 are each peripheral walls that are connected to the cover body top wall CB2 and that are connected to each other in succession so as to define a continuous and uninterrupted peripheral skirt that projects outwardly from the top wall CB2 such that the concave space P of the cover device C is defined between an inner surface of the top wall CB2 that is oriented toward the space P and the inner surfaces of the peripheral skirt walls CB3-CB6 (the inner surfaces of the peripheral skirt walls being the surfaces that are oriented inwardly toward the other walls of the peripheral skirt).

The cover body top wall CB2 can include a plurality of indicator openings IO that are located and dimensioned to be respectively aligned with the various indicator lights I of the module M to allow the indicator lights I to be visualized or perceived through the indicator openings IO of the cover device C by a user when the cover device C is operatively installed on the module M as shown in FIG. 2 and described herein. The cover device C can also include a plurality of connector openings XO that are defined through the top wall CB2 of the cover body CB and that are typically circular in shape and located and dimensioned to be respectively aligned with the multiple connectors X of the plastic module M such that the connectors X are accessible through the respective connector openings XO (for one or more connectors X that are flush with or recessed relative to the module housing top surface H2) and/or such that the connectors X project outwardly through the respective connector openings XO (for one or more connectors X that project outwardly from the module housing top surface H2) for connecting of a mating cable or a dust cover XC therewith. Those of ordinary skill in the art will recognize that when the cover device C is operatively installed on the plastic module M to define the protected module MC, the cover device C does not interfere with mounting or operation of the underlying module M so that the protected module MC functions in the same manner as the underlying module M except that the cover device C protects the underlying plastic module housing H from the deleterious effects of hot weld spatter or other hot substances. In this regard, the connector dust covers XC are each preferably also defined from metal so as to resist damage from hot weld spatter or other hot materials that come into contact therewith.

As noted above and seen in FIGS. 5 & 6, the top wall CB2 of the cover body B includes an inner surface CB2$i$ that is oriented inwardly toward the cover space P. This inner surface CB2$i$ includes one or more ribs R (preferably of uniform height with respect to each other) that project outwardly therefrom into the cover space P and that are adapted to contact the top wall M2 of the plastic module housing H when the cover device C is operatively installed on the module as can be seen in the section view of FIG. 8. The presence of these ribs R ensures that the inner surface CB2*i* of the cover body CB does not make intimate contact with the module housing top wall H2 when the cover device C is installed so that a thermally insulative air gap G (FIGS. 7 & 8) is defined between the inner surface CB2*i* of the cover body top wall CB2 and the module housing top surface H2. In this manner, the gap G provides a thermally insulative space that inhibits transmission of heat caused by weld spatter or similar from the top wall CB2 of the cover body CB to the top wall H2 of the plastic housing H. In one embodiment, the air gap G can be inclusively between 0.75 and 1.25 millimeters (mm) such as 1.0 mm.

With continuing reference to FIGS. 5-8, the ribs can be located so as to continuously surround the indicator openings IO and/or the connector openings XO, i.e., a respective single continuously extending and uninterrupted rib R can surround each opening in the cover C such as each indicator opening 10 and each connector opening XO. When so located, each such rib R forms a continuous and uninterrupted seal interface or seal L (see greatly enlarged FIG. 8) where the ribs R contact the plastic housing top wall H2 and surround the indicator light I (in the case of an indicator opening 10) or surround the connector X (in the case of a connector opening XO). These seal interfaces L prevent ingress of water or other liquids or dust and other particulate contaminates into the gap G between the cover C and plastic module housing H through the openings IO,XO as could lead to ingress of the same contaminates into the internals space S of the plastic module housing H where the contaminates could damage the internal electronics PCBA,E. In one embodiment, the seal interfaces L are IP67 compliant. An O-ring or similar elastomeric seal can extend along the seal interface L between the rib R and the top wall H2 of the plastic module housing H.

Figure 9:
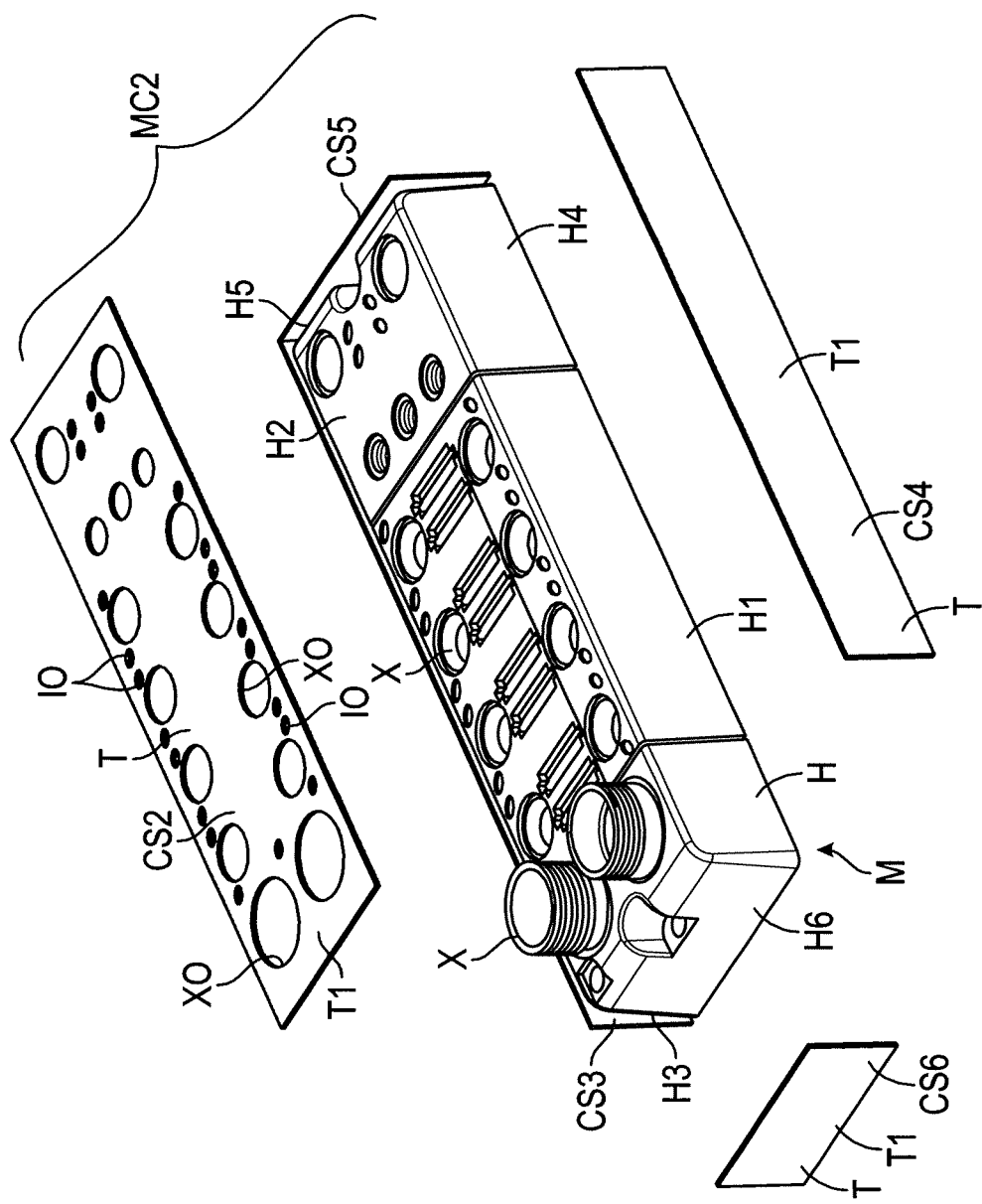
FIG. 9 is an exploded isometric view of an electronics module with a protective cover device provided in accordance with an alternative embodiment of the present development, including a conventional plastic electronics module and a protective cover device that is adapted to be connected to and cover the plastic module to protect the plastic module from weld spatter and other hot materials.
Figure 10:
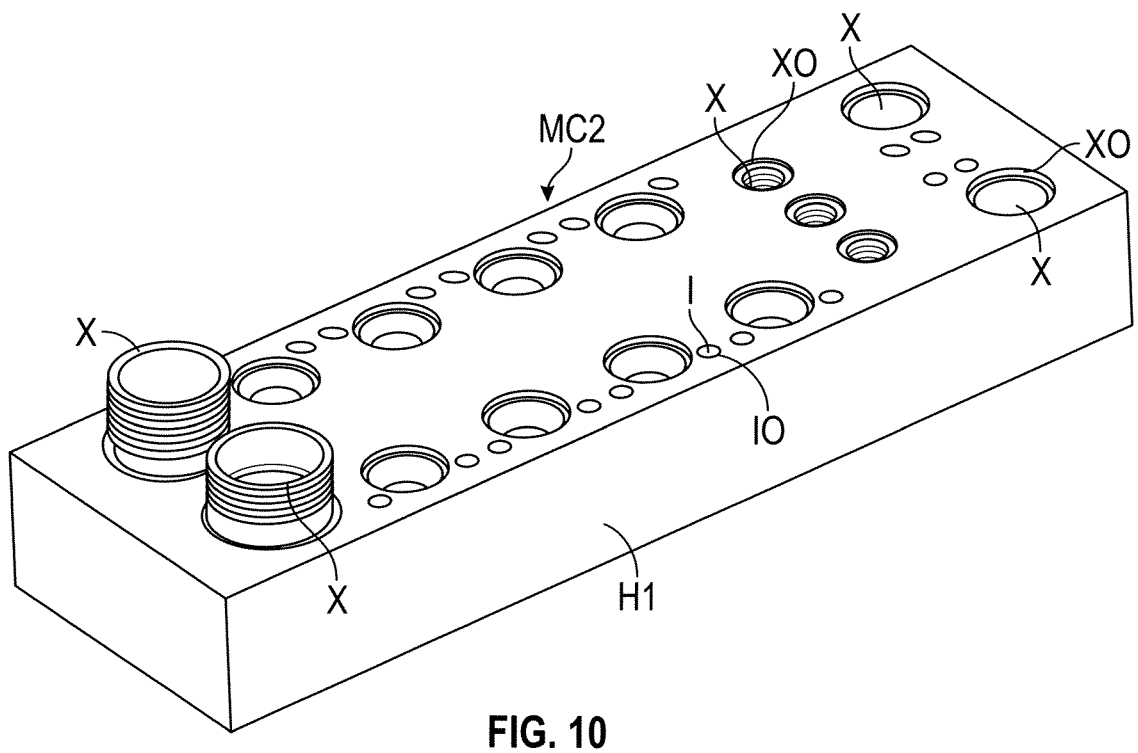
FIG. 10 is a fully assembled isometric view of the module of FIG. 9.

FIG. 9 is an exploded isometric view of a spatter protected electronics module MC2 provided in accordance with an alternative embodiment of the present development. Except as otherwise shown and/or described herein, the protected module MC2 is the same as the protected module MC. The protected module MC2 includes the conventional plastic electronics module M as described above and also includes a protective cover device or cover C2 that is adapted to be connected to and cover the plastic module M to protect the plastic module housing H from weld spatter and other hot materials. The cover device C2 performs the same function as the cover device C described above but has a different structure and installation method as described herein. FIG. 10 is an isometric view of the protected module MC2 with the protective cover device C2 fully and operably installed on the plastic module housing H. Unlike the cover C, which is a one-piece structure, the cover device C2 is a multi-piece structure that is assembled in place by affixing a plurality of separate metallic cover sections such as the illustrated top, left side, right side, first end, and second end cover sections CS2,CS3,CS4,CS5,CS6 (generally CS) to the respective surfaces H2,H3,H4,H5,H6 of the plastic module housing H to construct the protected module MC2 of FIGS. 9 & 10.

Figure 9A:
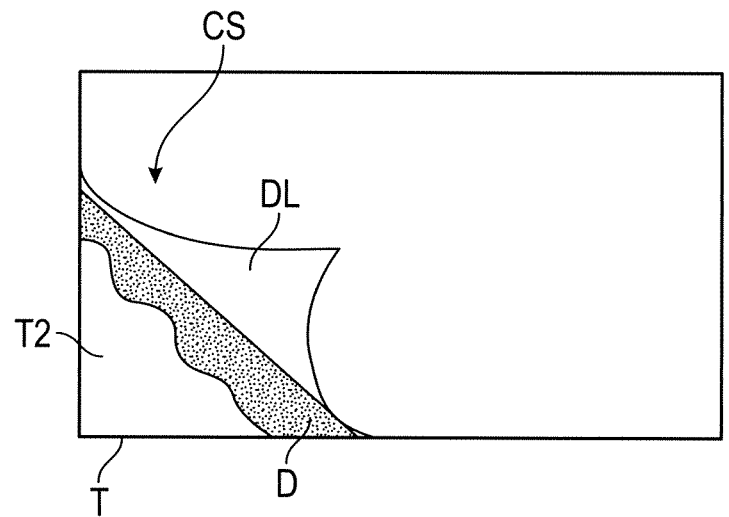
FIG. 9A is a bottom plan view of a cover section provided in accordance with an embodiment of the present development.

Referring also to FIG. 9A, in one embodiment, the cover sections CS2-CS6 each comprise a metal sheet T that is dimensioned to extend coextensively with the respective module housing surface H2-H6 to which it is to be affixed. The metal sheet T can comprise a metal such as aluminum (which can be optionally coated or plated with nickel another plating or coating material), stainless steel, zinc, or another suitable metal. The metal sheet T used for the top cover section CS2 can include the indicator light openings IO and connector openings XO as described in relation to the cover C. In the illustrated example, the metal sheet T of each cover section CS2-CS6 includes an outer face T1 that is exposed and oriented outwardly away from the plastic module housing H and includes an opposite inner face T2 (FIG. 9A) that is oriented inwardly toward the plastic module housing H. The inner face T2 can include an adhesive D for adhesively securing the cover section CS to the plastic module housing H. The adhesive D can be provided as a double-sided tape or film adhesive with a removable release liner DL that can be removed by a user immediately prior to the cover section CS being adhesively secured to the plastic module housing H by the adhesive D. The adhesive D also prevents ingress of water or other contaminants between each cover section CS and the plastic housing H and also can also thermally insulate the plastic housing H from the heated cover sheet CS when the adhesive is provided as a double-sided tape including a thermally insulative substrate (such as foam).

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The following is claimed:

1. An electronics module comprising:
   a plastic housing including an interior space containing a printed circuit board assembly including electronic components and a top surface on which a plurality of electrical connectors are located, wherein said electrical connectors project outwardly from said top surface;
   a cover fixedly secured to said plastic housing to protect said plastic housing from hot spatter materials, said cover comprising:
   a top wall that covers said top surface of said plastic housing, wherein said top wall comprises a plurality of connector openings respectively aligned with said plurality of electrical connectors located on said top surface of said plastic housing;
   a skirt that projects outwardly from said top wall;
   a concave space between said top wall and said skirt; and
   a plurality of ribs projecting from an inner face of said top wall into said concave space, wherein at least one of the plurality of ribs continuously surrounds one of the connector openings and forms a continuous seal with the top surface of the plastic housing.

2. The electronics module as set forth in claim 1, wherein at least one of the connectors extends through one of the plurality of connector openings of the cover.

3. The electronics module as set forth in claim 1, wherein said cover comprises metal.

4. The electronics module as set forth in claim 3, wherein said cover comprises a one-piece metallic cover body.

5. The electronics module as set forth in claim 3, wherein said cover comprises a plurality of separate cover sections that are secured to said plastic housing.

6. The electronics module as set forth in claim 5, wherein each of said cover sections comprise a metal sheet and an adhesive applied to an inner surface of the metal sheet, said adhesive adhesively connecting said metal sheet to said plastic housing.

7. The electronics module as set forth in claim 1, wherein said skirt comprises: (i) a left side wall; (ii) a right side wall spaced apart from the left side wall; (iii) a first end wall that extends between and interconnects the left side wall and the right side wall; and (iv) a second end wall that is spaced apart from the first end wall and that extends between and interconnects the left side wall and the right side wall.

8. The electronics module as set forth in claim 1, wherein each of said ribs is abutted with the top surface of the plastic housing to establish a thermally insulative air gap between said cover top wall and said top surface of said plastic housing.

9. The electronics module as set forth in claim 8, wherein said continuous seal inhibits ingress of liquid into said air gap through said connector opening.

10. The electronics module as set forth in claim 1, wherein said top wall further comprises a plurality of indicator openings that are each aligned with a respective indicator light located on said top surface of said plastic housing.

11. A spatter protection cover for an electronics module, said cover comprising:
 a metallic top wall comprising a plurality of connector openings and a plurality of indicator openings, said metallic top wall adapted to be positioned in covering relation with an associated module top surface with said connector openings and said indicator openings aligned respectively with associated connectors and associated indicator lights located on the associated module top surface;
 a skirt that projects outwardly from said top wall;
 a concave space between said top wall and said skirt; and
 a plurality of ribs projecting from an inner face of said top wall into said concave space, wherein at least one of the plurality of ribs continuously surrounds one of the connector openings and indicator openings and forms a continuous seal with the associated module top surface.

12. The spatter protection cover as set forth in claim 11, wherein said skirt comprises:
 left and right side metallic walls connected to the top wall and spaced apart from each other;
 first and second metallic end walls connected to the top wall and spaced apart from each other and extending between the left and right side walls.

13. The spatter protection cover as set forth in claim 12, wherein each of said top wall, said left and right side walls, and said first and second end walls include an inner surface comprising an adhesive thereon.

14. The spatter protection cover as set forth in claim 11, wherein said plurality of ribs abut the associated module top surface to maintain a thermally insulative air gap between the associated module top surface and the inner surface of the top wall.

15. The spatter protection cover as set forth in claim 11, wherein each of said connector openings and said indicator openings is continuously surrounded by one of said plurality of ribs.

16. The spatter protection cover as set forth in claim 11, wherein said top wall and said skirt are defined as a single one-piece construction.

* * * * *